US008735258B2

(12) United States Patent
Ko et al.

(10) Patent No.: US 8,735,258 B2
(45) Date of Patent: May 27, 2014

(54) INTEGRATED CIRCUIT RESISTOR FABRICATION WITH DUMMY GATE REMOVAL

(75) Inventors: Chun-Hung Ko, Hemei Township, Changhua County (TW); Jyh-Huei Chen, Hsinchu (TW); Shyh-Wei Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 13/343,903

(22) Filed: Jan. 5, 2012

(65) Prior Publication Data
US 2013/0178039 A1 Jul. 11, 2013

(51) Int. Cl.
*H01L 21/02* (2006.01)
*H01L 21/20* (2006.01)

(52) U.S. Cl.
CPC .............. *H01L 21/02* (2013.01); *H01L 21/20* (2013.01)
USPC .................... 438/382; 257/379; 257/E21.004; 257/E21.001; 257/E21.002; 257/E21.003

(58) Field of Classification Search
CPC .......... H01L 21/00; H01L 27/00; H01L 28/00; H01L 29/00
USPC ........... 438/382; 257/379, E21.004, E21.001, 257/E21.002, E21.003
See application file for complete search history.

(56) References Cited

U.S. PATENT DOCUMENTS

2011/0073956 A1* 3/2011 Heinrich et al. .............. 257/379
2011/0156162 A1* 6/2011 Richter et al. ................ 257/379

* cited by examiner

*Primary Examiner* — Chuong A Luu
*Assistant Examiner* — Moazzam Hossain
(74) *Attorney, Agent, or Firm* — Haynes and Boone, LLP

(57) ABSTRACT

Methods of fabricating a semiconductor device including a metal gate transistor and a resistor are provided. A method includes providing a substrate including a transistor device region and an isolation region, forming a dummy gate over the transistor device region and a resistor over the isolation region, and implanting the resistor with a dopant. The method further includes wet etching the dummy gate to remove the dummy gate, and then forming a metal gate over the transistor device region to replace the dummy gate.

18 Claims, 4 Drawing Sheets

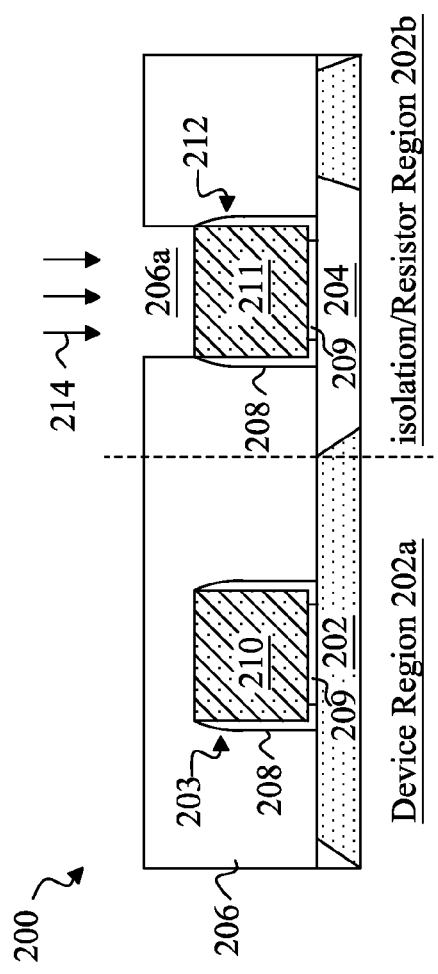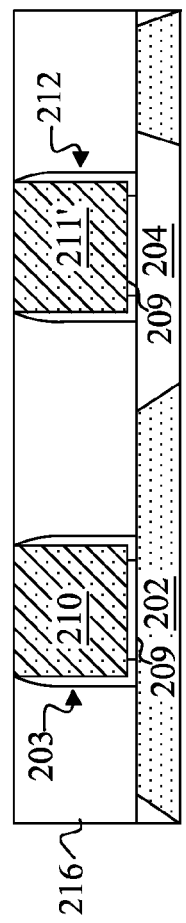
FIG.2A
FIG.2B

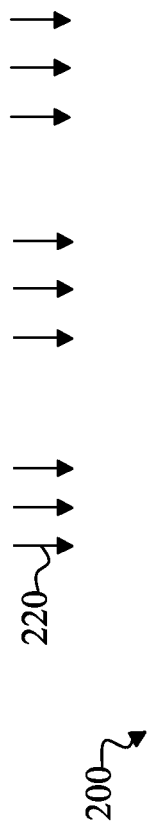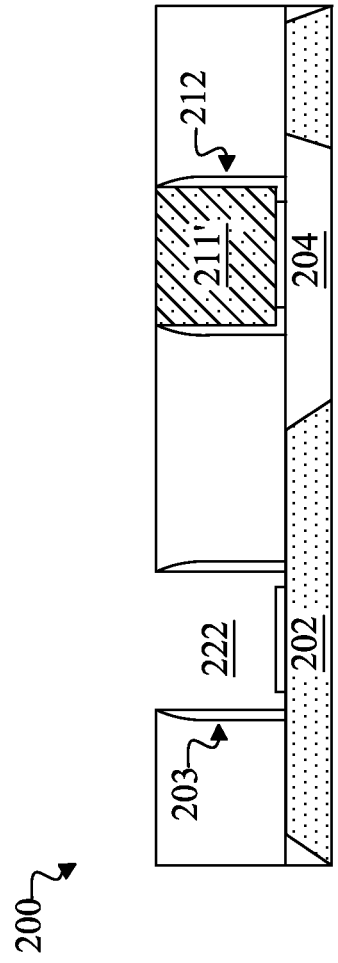
FIG.2C
FIG.2D

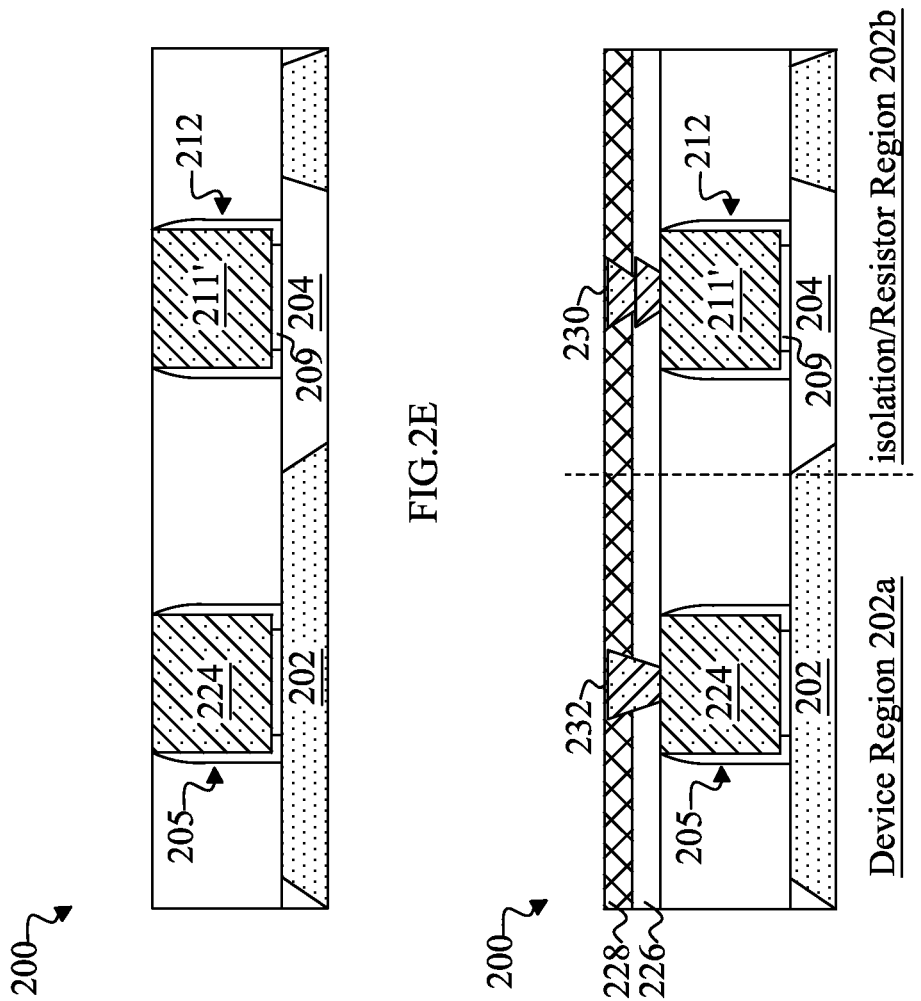

INTEGRATED CIRCUIT RESISTOR FABRICATION WITH DUMMY GATE REMOVAL

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs.

During the scaling trend, various materials have been used for the gate electrode and gate dielectric in field effect transistors (FET). One approach is to fabricate these devices with a dummy polysilicon gate and replace the dummy gate with a metal material for the gate electrode. However, high-k metal gate (HKMG) devices fabricated with an IC resistor often require a complex process to remove and replace the dummy polysilicon.

SUMMARY

The present disclosure provides for many different embodiments. One of the broader forms of the present disclosure involves a method of fabricating a semiconductor device, the method comprising providing a substrate including a transistor device region and an isolation region, forming a dummy gate over the transistor device region and a resistor over the isolation region, and implanting the resistor with a dopant. The method further includes wet etching the dummy gate to remove the dummy gate (e.g., in one embodiment removing the entire dummy gate), and then forming a metal gate over the transistor device region to replace the dummy gate.

Another of the broader forms of the present disclosure involves another method of fabricating a semiconductor device, the method comprising providing a substrate including a transistor device region and an isolation region, forming a dummy gate over the transistor device region and a resistor over the isolation region, and implanting the resistor with a dopant through a photoresist covering the dummy gate and exposing the resistor by an aperture. The method further includes removing the photoresist, forming an interlayer dielectric (ILD) layer over the implanted resistor and the dummy gate, planarizing the ILD layer to expose the dummy gate and the implanted resistor, wet etching the dummy gate to remove the dummy gate (e.g., in one embodiment removing the entire dummy gate), and forming a metal gate over the transistor device region to replace the dummy gate.

Yet another of the broader forms of the present disclosure involves yet another method of fabricating a semiconductor device. The method includes providing a substrate including a transistor device region and an isolation region, forming a dummy gate over the transistor device region and a resistor over the isolation region, implanting the resistor with a dopant through a photoresist covering the dummy gate and exposing the resistor by an aperture, removing the photoresist, forming a first interlayer dielectric (ILD) layer over the implanted resistor and the dummy gate, planarizing the first ILD layer to expose the dummy gate and the implanted resistor. The method further includes wet etching the dummy gate to remove the dummy gate (e.g., in one embodiment removing the entire dummy gate), forming a metal gate over the transistor device region to replace the dummy gate, forming a second interlayer dielectric (ILD) layer over the implanted resistor and the metal gate, and forming a first contact through the second ILD layer over the metal gate and a second contact through the second ILD layer over the resistor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2F illustrate sectional views of a semiconductor device at various stages of fabrication in accordance with embodiments of the present disclosure.

DETAILED DESCRIPTION

Figure 1:
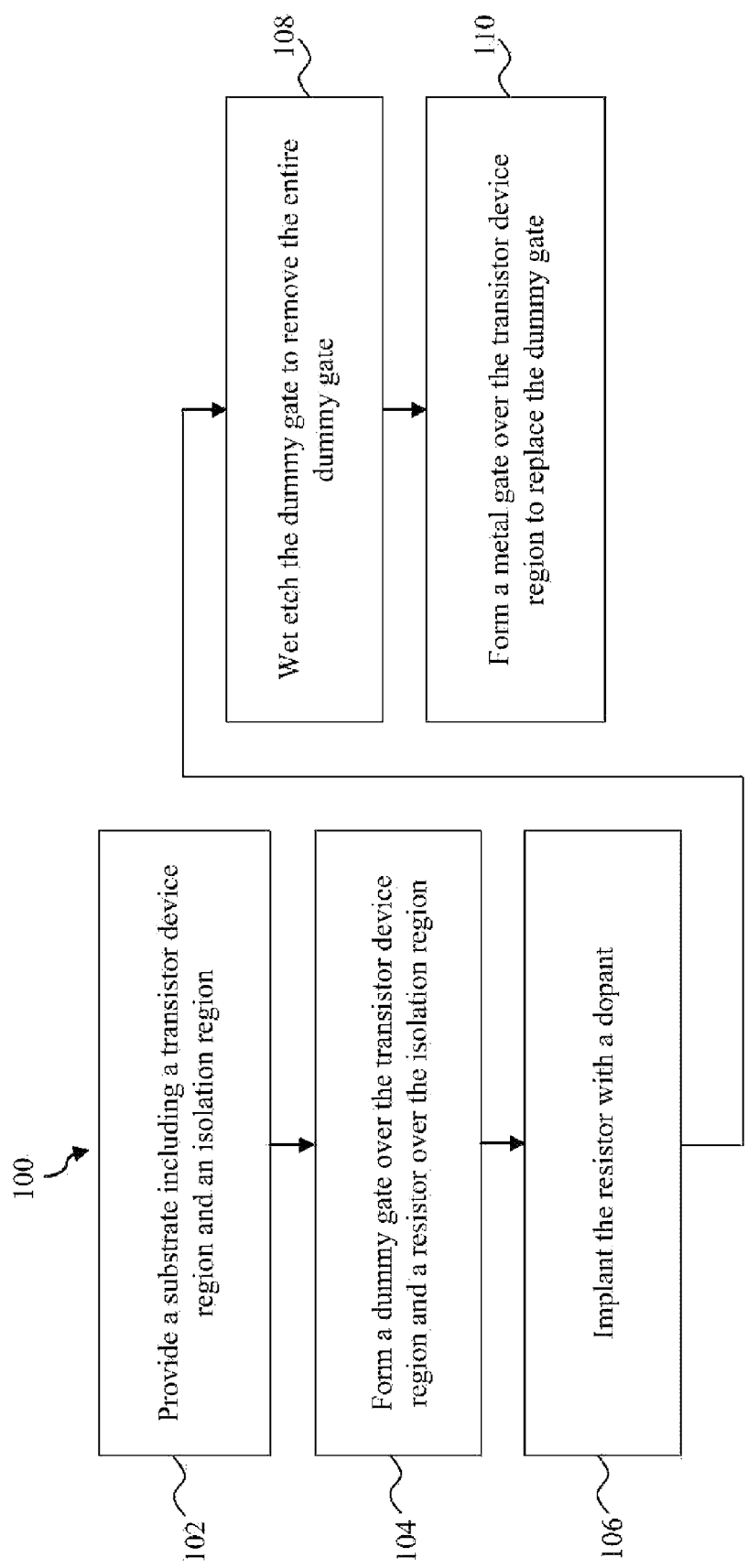
FIG. 1 is a flowchart showing a method of fabricating a semiconductor device in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1, a flowchart shows a method 100 of fabricating a semiconductor device in accordance with embodiments of the present disclosure. Method 100 includes providing a substrate including a transistor device region and an isolation region at block 102, forming a dummy gate over the transistor device region and a resistor over the isolation region at block 104, implanting the resistor with a dopant at block 106, wet etching the dummy gate to remove the dummy gate at block 108 (e.g., in one embodiment removing the entire dummy gate), and forming a metal gate over the transistor device region to replace the dummy gate at block 110.

It should be noted that the operations of method 100 may be rearranged or otherwise modified within the scope of the various aspects. It is further noted that additional processes may be provided before, during, and after the method 100, and that some other processes may only be briefly described herein. Thus, other implementations are possible within the scope of the various aspects described herein.

According to an aspect of the present disclosure, forming the resistor may include depositing polysilicon or amorphous silicon.

According to another aspect of the present disclosure, implanting the resistor may include implanting silicon, germanium, carbon, xenon, indium, barium fluoride, an n-type dopant, and/or a p-type dopant.

According to another aspect of the present disclosure, implanting the resistor may include implanting the resistor through a photoresist covering the dummy gate and exposing the resistor by an aperture.

According to another aspect of the present disclosure, implanting the resistor may include implanting a dopant at an implant concentration ranging between about 1e14 and about 8e15.

According to another aspect of the present disclosure, wet etching the dummy gate may include etching with potassium hydroxide (KOH), tetramethylammonium hydroxide (TMAH), or ammonium hydroxide ($NH_4OH$).

According to another aspect of the present disclosure, wet etching the dummy gate may include etching the dummy gate for between about 60 seconds and about 200 seconds.

According to another aspect of the present disclosure, method 100 may further comprise forming a first interlayer dielectric (ILD) layer over the implanted resistor and the dummy gate, and planarizing the first ILD layer to expose the dummy gate and the implanted resistor.

According to another aspect of the present disclosure, method 100 may further comprise forming a second interlayer dielectric (ILD) layer over the implanted resistor and the metal gate, and forming a first contact through the second ILD layer over the metal gate and a second contact through the second ILD layer over the resistor.

Referring now to FIGS. 2A-2F, sectional views of a semiconductor device 200 at various stages of fabrication are illustrated in accordance with embodiments of the present disclosure. It should be understood that additional processes may be provided before, during, and/or after the stages illustrated in FIGS. 2A-2F, and that some selected processes may only be briefly described if they are well known in the art.

FIG. 2A illustrates semiconductor device 200 including a substrate 202 having a device region 202a and a resistor region or isolation region 202b. A high-k metal gate (HKMG) device 203 will be formed over the device region 202a of substrate 202, and a resistor 212 will be formed over the isolation region 202b of substrate 202 having an isolation structure 204.

The HKMG device 203 includes a dummy gate 210 between sidewall spacers 208. Dummy gate 210 may be formed by polysilicon or amorphous silicon deposition, planarization by CMP or etch, and patterning (e.g., via photolithography and etch techniques). The device spacers 208 may be comprised of a dielectric material, such as silicon nitride. Alternatively, the device spacers may be silicon carbide, silicon oxynitride, other suitable materials, and/or combinations thereof. Also, the device spacers may each be composed of a different material.

Resistor 212 includes a resistor layer 211 between sidewall spacers 208. Pre-implant resistor layer 211 may be formed by polysilicon or amorphous silicon deposition, planarization by CMP or etch, and patterning (e.g., via photolithography and etch techniques). The resistor spacers 208 may be comprised of a dielectric material, such as silicon nitride. Alternatively, the resistor spacers may be silicon carbide, silicon oxynitride, other suitable materials, and/or combinations thereof. Also, the resistor spacers may each be composed of a different material.

In one example, a high-k (HK) dielectric layer 209 may be formed between spacers 208 and over substrate 202. In one example, dummy gate 210 and resistor layer 211 may be formed over dielectric layer 209, and HK dielectric layer 209 may function as a metal gate dielectric layer for a subsequently formed metal gate. In one embodiment, HK dielectric layer 209 may be comprised of hafnium oxide (HfOx), hafnium silicon oxide (HfSiO), and/or hafnium silicon oxynitride (HfSiON). HK dielectric layer 209 may be formed as a single layer, or it may optionally include additional layers such as an interfacial layer between the substrate surface and the remainder of the HK dielectric layer.

HKMG device 203 and resistor 212 are formed within a photoresist layer 206 in this embodiment. Photoresist layer 206 covers device 203 and exposes resistor 212 via an aperture 206a. In other embodiments, HKMG device 203 and resistor 212 maybe formed within an interlayer dielectric (ILD) layer.

In one embodiment, the semiconductor device is formed on a silicon semiconductor substrate 202. Alternatively, the semiconductor substrate 202 could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Isolation structure 204 may be comprised of a region of dielectric material formed in a trench etched into the substrate. In one embodiment, isolation structure 204 may utilize shallow trench isolation (STI) to define and electrically isolate devices. An isolation structure may be composed of silicon oxide in one example. However, in other alternative embodiments, the dielectric material could be silicon nitride, silicon oxynitride, other suitable materials, and/or combinations thereof. An isolation structure may alternatively have a multi-layer structure such as a thermal oxide liner layer filled with silicon nitride or silicon oxide.

Arrows 214 illustrate an implantation process of resistor 212 in accordance with embodiments of the present disclosure. Example implantation parameters may be similar to those described above with respect to method 100 of FIG. 1. According to an aspect of the present disclosure, the resistor layer 211 may be implanted with silicon, germanium, carbon, xenon, indium, barium fluoride, an n-type dopant, and/or a p-type dopant. A pre-amorphization implant (PAI) (e.g., silicon or germanium) may be used to activate carbon and dopants. According to another aspect of the present disclosure, the resistor layer 211 may be implanted with a dopant at an implant concentration between about 1e14 and about 8e15.

FIG. 2B illustrates resistor 212 having implanted resistor layer 211' after implantation process 214. In one example, the ion implant of resistor layer 211' may include silicon, germanium, carbon, xenon, indium, barium fluoride, an n-type dopant, and/or a p-type dopant. In another example, the ion implant concentration of resistor layer 211' may range between about 1e14 and about 8e15.

The photoresist layer 206 is removed (e.g., by stripping or ashing) and then an interlayer dielectric (ILD) layer 216 may be formed by dielectric deposition and planarization (e.g., by CMP).

FIG. 2C illustrates a wet etch process 220 to selectively remove dummy gate 210 and leave resistor 212 intact, and FIG. 2D illustrates device 200 with dummy gate 210 removed leaving space 222 between the sidewall spacers. In one embodiment, the wet etch process 220 is a full-wet etch that removes substantially the dummy gate 210 in a single process but leaves resistor 212 substantially intact. In one embodiment the entire dummy gate is removed. Example wet etch parameters may be similar to those described above with respect to method 100 of FIG. 1.

FIG. 2E illustrates replacement of dummy gate 210 with metal gate 224 to form HKMG device 205. Metal gate 224 is formed by metal deposition and then planarization, which may result in metal gate 224 having a smaller thickness than dummy gate 210. Various thicknesses of metal gate 224 before and after planarization are within the scope of the present disclosure. Back-end-of-line thermal processing may then be performed on resistor 212.

In this gate replacement process, the dummy gates 210 are removed and replaced with metal select gates 224. In one embodiment, a non-illustrated photoresist layer may be deposited and patterned to facilitate etching that effects the removal. The dummy gates are removed by a single wet etching process. After etching away the dummy gates and then stripping the photoresist, a metal layer may be formed and then planarized to form the metal gate structures 224 as shown in FIG. 2E.

FIG. 2F illustrates the formation of a plurality of interlayer dielectric (ILD) layers 226 and 228 over the resistor 212 and the HKMG device 205, a first contact 230 over and contacting the resistor 212 through the plurality of ILD layers, and a second contact 232 over and contacting the HKMG device 205 through the plurality of ILD layers.

FIG. 2F thus illustrates a semiconductor device 200 comprising a substrate 202 including a device region 202a and an isolation region 202b; a resistor 212 disposed over the isolation region, wherein the resistor includes an implanted resistor layer 211'; a high-k metal gate (HKMG) device 205 disposed over the device region, the HKMG device including a metal gate 224 disposed over the device region; a plurality of interlayer dielectric (ILD) layers 226, 228 disposed over the resistor 212 and the HKMG device 205; a first contact 230 disposed over and contacting the implanted resistor layer 211' through the plurality of ILD layers; and a second contact 232 disposed over and contacting the HKMG device metal gate 224 through the plurality of ILD layers.

The ILD layers described above may be comprised of silicon oxide. Alternatively, the ILD layer may include other dielectric materials such as silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), xerogel, aerogel, amorphous fluorinated carbon, parylene, BCB (bisbenzocyclobutenes), SiLK® (Dow Chemical, Midland, Mich.), polyimide, other proper materials, and/or combinations thereof. An ILD layer may alternatively be a multilayer structure having multiple dielectric materials.

The gate contacts 232, 230 described above may be any of a variety of cross-sectional shapes. The source and drain contacts may also be comprised of various suitable conductive materials, such as copper or tungsten. In one embodiment, an opening may be etched through the ILD layer at a location above a source and/or drain region. The opening may then be filled with a metal. The above contact formation processes may include photolithography, etching, stripping, deposition, and any other appropriate procedures. Lastly, a CMP process is performed to planarize the top portions of the ILD layer.

The layers described above (e.g., the polysilicon and metal layers) may each be formed using any suitable process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

The layers may be patterned by any suitable process, such as by a photolithography patterning process, which may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing.

Additionally, the integrated circuit in the semiconductor device 200 can further include non-illustrated passive components such as resistors, capacitors, inductors, and/or fuses; and not-illustrated active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

Advantageously, the present disclosure provides for a simplified process for fabricating a semiconductor device including a HKMG transistor device and a resistor by a full-wet etch process to remove a dummy gate without requiring the use of extra etch steps, layers, hard masks, and/or photoresist. Previous processes have used extra dry etch and/or wet etch processes, extra hard masks, and/or extra photoresist layers to remove a dummy gate. Thus, the present disclosure provides for a simplified process that lowers costs of device fabrication.

The present disclosure provides for many different embodiments. One of the broader forms of the present disclosure involves a method of fabricating a semiconductor device, the method comprising providing a substrate including a transistor device region and an isolation region, forming a dummy gate over the transistor device region and a resistor over the isolation region, and implanting the resistor with a dopant. The method further includes wet etching the dummy gate to remove the dummy gate, and then forming a metal gate over the transistor device region to replace the dummy gate.

Another of the broader forms of the present disclosure involves another method of fabricating a semiconductor device, the method comprising providing a substrate including a transistor device region and an isolation region, forming a dummy gate over the transistor device region and a resistor over the isolation region, and implanting the resistor with a dopant through a photoresist covering the dummy gate and exposing the resistor by an aperture. The method further includes removing the photoresist, forming an interlayer dielectric (ILD) layer over the implanted resistor and the dummy gate, planarizing the ILD layer to expose the dummy gate and the implanted resistor, wet etching the dummy gate to remove the dummy gate, and forming a metal gate over the transistor device region to replace the dummy gate.

Yet another of the broader forms of the present disclosure involves yet another method of fabricating a semiconductor device. The method includes providing a substrate including a transistor device region and an isolation region, forming a dummy gate over the transistor device region and a resistor over the isolation region, implanting the resistor with a dopant through a photoresist covering the dummy gate and exposing the resistor by an aperture, removing the photoresist, forming a first interlayer dielectric (ILD) layer over the implanted resistor and the dummy gate, planarizing the first ILD layer to expose the dummy gate and the implanted resistor. The method further includes wet etching the dummy gate to remove the dummy gate, forming a metal gate over the transistor device region to replace the dummy gate, forming a second interlayer dielectric (ILD) layer over the implanted resistor and the metal gate, and forming a first contact through the second ILD layer over the metal gate and a second contact through the second ILD layer over the resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   providing a substrate including a transistor device region and an isolation region;
   forming a dummy gate over the transistor device region and a resistor over the isolation region;
   forming a photoresist layer over the transistor region and the isolation region to cover and laterally surround the dummy gate and expose the resistor by an aperture;
   implanting the resistor with a dopant;
   wet etching the dummy gate to remove the dummy gate;
   forming a metal gate over the transistor device region to replace the dummy gate;
   forming a first interlayer dielectric (ILD) layer over the implanted resistor and the metal gate;
   forming a first contact through the first ILD layer over the metal gate and a second contact through the first ILD layer over the resistor;
   forming a second interlayer dielectric (ILD) layer over the first ILD layer, the first contact, and the second contact; and
   forming a third contact through the second ILD layer over the second contact.

2. The method of claim 1, wherein forming the dummy gate and the resistor includes depositing polysilicon or amorphous silicon.

3. The method of claim 1, wherein implanting the resistor includes implanting silicon, germanium, carbon, xenon, an n-type dopant, and/or a p-type dopant.

4. The method of claim 1, wherein implanting the resistor includes implanting the resistor through the photoresist layer.

5. The method of claim 1, wherein wet etching the dummy gate includes etching with potassium hydroxide (KOH), tetramethylammonium hydroxide (TMAH), or ammonium hydroxide (NH$_4$OH).

6. The method of claim 1, wherein implanting the resistor includes implanting a dopant at an implant concentration ranging between about 1E14 atoms/cm$^3$ and about 8E15 atoms/cm$^3$, and wherein wet etching the dummy gate includes etching the dummy gate for between about 60 seconds and about 200 seconds.

7. The method of claim 1, further comprising:
removing the photoresist layer;
forming a third interlayer dielectric (ILD) layer over the implanted resistor and the dummy gate; and
planarizing the third ILD layer to expose the dummy gate and the implanted resistor.

8. A method of fabricating a semiconductor device, the method comprising:
providing a substrate including a transistor device region and an isolation region;
forming a dummy gate over the transistor device region and a resistor over the isolation region;
forming a photoresist layer over the transistor region and the isolation region to cover and laterally surround the dummy gate and expose the resistor by an aperture;
implanting the resistor with a dopant through the photoresist layer;
removing the photoresist layer;
forming a first interlayer dielectric (ILD) layer over the implanted resistor and the dummy gate;
planarizing the first ILD layer to expose the dummy gate and the implanted resistor;
wet etching the dummy gate to remove the dummy gate;
forming a metal gate over the transistor device region to replace the dummy gate;
forming a first contact over and contacting the metal gate through the first ILD layer and a second contact over and contacting the resistor through the first ILD layer;
forming a second interlayer dielectric (ILD) layer over the first ILD layer, the first contact, and the second contact, and
forming a third contact over and contacting the second contact through the second ILD layer.

9. The method of claim 8, wherein forming the dummy gate and the resistor includes depositing polysilicon or amorphous silicon.

10. The method of claim 8, wherein implanting the resistor includes implanting silicon, germanium, carbon, xenon, an n-type dopant, and/or a p-type dopant.

11. The method of claim 8, wherein wet etching the dummy gate includes etching with potassium hydroxide (KOH), tetramethylammonium hydroxide (TMAH), or ammonium hydroxide (NH$_4$OH).

12. The method of claim 8, wherein implanting the resistor includes implanting a dopant at an implant concentration ranging between about 1E14 atoms/cm$^3$ and about 8E15 atoms/cm$^3$, and wherein wet etching the dummy gate includes etching the dummy gate for between about 60 seconds and about 200 seconds.

13. A method of fabricating a semiconductor device, the method comprising:
providing a substrate including a transistor device region and an isolation region;
forming a dummy gate over the transistor device region and a resistor over the isolation region;
forming a photoresist layer over the transistor region and the isolation region to cover and laterally surround the dummy gate and expose the resistor by an aperture;
implanting the resistor with a dopant through the photoresist layer;
removing the photoresist layer;
forming a first interlayer dielectric (ILD) layer over the implanted resistor and the dummy gate;
planarizing the first ILD layer to expose the dummy gate and the implanted resistor;
wet etching the dummy gate to remove the dummy gate;
forming a metal gate over the transistor device region to replace the dummy gate;
forming a second interlayer dielectric (ILD) layer over the implanted resistor and the metal gate; and
forming a first contact through the second ILD layer over the metal gate and a second contact through the second ILD layer over the resistor;
forming a third interlayer dielectric (ILD) layer over the second ILD layer, the first contact, and the second contact; and
forming a third contact through the third ILD layer over the second contact.

14. The method of claim 13, wherein forming the dummy gate and the resistor includes depositing polysilicon or amorphous silicon.

15. The method of claim 13, wherein implanting the resistor includes implanting silicon, germanium, carbon, xenon, an n-type dopant, and/or a p-type dopant.

16. The method of claim 13, wherein implanting the resistor includes implanting a dopant at an implant concentration ranging between about 1E14 atoms/cm$^3$ and about 8E15 atoms/cm$^3$.

17. The method of claim 13, wherein wet etching the dummy gate includes etching with potassium hydroxide (KOH), tetramethylammonium hydroxide (TMAH), or ammonium hydroxide (NH$_4$OH).

18. The method of claim 13, wherein wet etching the dummy gate includes etching the dummy gate for between about 60 seconds and about 200 seconds.

* * * * *